United States Patent
Takahashi et al.

[11] Patent Number: 5,976,965
[45] Date of Patent: Nov. 2, 1999

[54] METHOD FOR ARRANGING MINUTE METALLIC BALLS

[75] Inventors: Nobuaki Takahashi; Naoji Senba; Yuzo Shimada, all of Tokyo, Japan

[73] Assignee: NEC Corporation, Tokyo, Japan

[21] Appl. No.: 09/098,528

[22] Filed: Jun. 17, 1998

[30] Foreign Application Priority Data

Jun. 18, 1997 [JP] Japan ..................................... 9-161126

[51] Int. Cl.$^6$ ................................................. H01L 21/607
[52] U.S. Cl. ................... 438/616; 257/738; 228/180.22; 228/246
[58] Field of Search ..................................... 438/613, 615, 438/616; 257/737, 738; 228/246, 254, 180.22, 264; 427/357

[56] References Cited

U.S. PATENT DOCUMENTS

| | | | |
|---|---|---|---|
| 3,251,600 | 5/1966 | Warnberg | 273/282.1 |
| 5,601,229 | 2/1997 | Nakazato et al. | 228/246 |
| 5,722,579 | 3/1998 | Yu et al. | 228/119 |
| 5,750,199 | 5/1998 | Sakemi | 228/180.22 |
| 5,888,850 | 3/1999 | Havens et al. | 438/127 |

FOREIGN PATENT DOCUMENTS

| | | |
|---|---|---|
| 58-122519 | 7/1983 | Japan . |
| 4-75357 | 3/1992 | Japan . |
| 6-310515 | 11/1994 | Japan . |
| 6-344132 | 12/1994 | Japan . |
| 8-32219 | 2/1996 | Japan . |
| 8-330716 | 12/1996 | Japan . |

*Primary Examiner*—Olik Chaudhuri
*Assistant Examiner*—Anh Duy Mai
*Attorney, Agent, or Firm*—Young & Thompson

[57] ABSTRACT

A method for arranging metallic balls to form an array of bump electrodes comprises the steps of immersing a silicon template in ethanol dropping metallic balls through the ethanol onto the template to receive the metallic balls in the holes of the template. The metallic balls are free from cohesion caused by electrostatic charge or moisture. The template may be inclined in the ethanol. The holes are formed by anisotropic etching a silicon plate.

7 Claims, 3 Drawing Sheets

METHOD FOR ARRANGING MINUTE METALLIC BALLS

BACKGROUND OF THE INVENTION (a) Field of the Invention

The present invention relates to a method for arranging minute metallic electrodes to form an array of bump electrodes for use in BGA (ball grid array), CSP (chip size package), and flip chip bonding techniques.

(b) Description of the Related Art

It is essential to arrange a higher number of external pins at a smaller pitch in view of the demand for a higher mounting density, lower device area and increasing capacity of the integrated circuits. Bump electrodes are generally used for the external pins using BGA, CSP and flip chip bonding techniques. Thus, in the method for forming an array of bump electrodes by arranging minute metallic balls or solder balls, it is important to arrange a large number of minute metallic balls efficiently at a small pitch. Some proposals have been made using arrangement tools or templates for arranging the metallic balls.

Referring to FIG. 1A showing a first conventional technique, proposed in JP-A-8(1996)-330716, an arrangement tool or template 19 is set up at a speed position on a mounting board 18 having terminals 24 thereon. The setup is obtained by aligning four guide pins 22 of the mounting board 18 with respective positioning holes 23 of the template 19. The template 19 has through-holes 20 for receiving solder balls (metallic balls) 21 at the positions corresponding to the terminals 24 on the mounting board 18. After the metallic balls are scattered on the template 19, some of the solder balls are received in the through-holes 20. A squeegee is used to scan the template 19 for receiving the remaining solder balls 21 in the through-holes 20 and for removing excess solder balls 21, thereby filling the through-holes 20 with the solder balls 21, as shown in FIG. 1B. The solder balls 21 mounted on the terminals 24 of mounting board 18 in the through-holes 20 are heated in a reflow furnace, and melted to form an array of solder bumps on the mounting board 18.

In the technique as mentioned above, it is possible to accurately position the template 19 and accordingly to accurately position the solder balls 21 onto the terminals 24. However, electrostatic charge is often generated on the solder balls 21 by the friction between the solder balls 21 or between the solder balls 21 and the template 19, which results in cohesion of the solder balls 21. It involves therefore a problem in that two or more of the solder balls 21 enter a single hole 20 of the template 19 to reduce the yield of the process. The cohesion of solder balls 21 may also be generated due to moisture in the atmosphere.

Referring to FIG. 2 showing a second conventional technique, descried in JP-A-6(1994)-310515, solder balls (metallic balls) 28 are supplied onto a feeder plate 27 in which a plurality of holes each for receiving a solder ball 28 are arranged. Each of the solder balls 28 is attracted to the bottom of the hole with vacuum formed by a vacuum pump 40. Excess solder balls 28 are ejected through an outlet 30 by raising a side cover 29 and supplying vibration from a vibrator 31. The feeder 27 is then transferred to the right, wherein ion air 48 is provided from an ion generator 47 onto the surface of the solder balls 28 and the feeder plate 27, which are often electrified due to friction by the vibration, to electrically neutralize the surface of the solder balls 28 and the feeder plate 27.

Compressed inert gas 46 is then supplied from a nozzle 45 to eject the neutralized and excess solder balls 28 through the outlet 30. The use of inert gas 46 prevents occurrence of adhesion, cohesion, bridging, oxidation and electrostatic charge in the solder balls 29. After the ejection, the feeder plate 27 is then subjected to inspection using a TV camera 44 to assure whether all the holes are filled with the solder balls 28. If there is any defect wherein a hole is not supplied with a solder ball or a plurality of solder balls are attached to a single hole, the feeder plate and the solder balls are not supplied to the next step.

In the second conventional technique, there is a problem in that the neutralization is not uniform among the solder balls 28 depending on the distance from the ion source 47 and the solder balls 28, which may cause electrostatic charge remaining on some of the solder balls 28. In addition, in the case of minute solder balls 28 having a diameter as low as 100 $\mu$m or less, a solder ball 28 normally received in a hole may be removed by the ion air or the compressed inert gas. The minute solder balls 28 may cohere also due to moisture.

Referring to FIG. 3 showing a third conventional technique, described in JP-A-4(1992)-75357, a template 56 has a plurarality of holes 57 arranged thereon which are communicated with a vacuum chanter 60 including therein a vacuum pump and an exhaust tube 59. Minute metallic balls 54 supplied onto a table 55 are attracted toward the template 56 while irradiated with ion beams supplied from an ion gun or ion blower 61. The minute metallic balls 54 each attracted to the array of the holes are transcribed to a semiconductor chip or a mounting board not shown. The third conventional technique has also problems similar those in the second conventional technique.

As described above, conventional techniques generally involved similar problems during arranging minute metallic balls.

SUMMARY OF THE INVENTION

It is therefore an object of the present invention to provide a method for arranging minute metallic balls or solder balls efficiently, while preventing adhesion of the balls together or adhesion of the balls to a template which may be caused by electrostatic charge or moisture.

The present invention provides a method for arranging metallic balls on a template having a plurality of holes, comprising the steps of immersing the template in a liquid, dropping the metallic balls through the liquid toward the template to receive the metallic balls in the respective holes.

In accordance with the method of the present invention, cohesion of the metallic balls due to electrostatic charge or moisture do not occur because of the reduction of the friction between the metallic balls in the liquid.

The above and other objects, features and advantages of the present invention will be more apparent from the following description, referring to the accompanying drawings.

PREFERRED EMBODIMENTS OF THE INVENTION

Figure 1A:
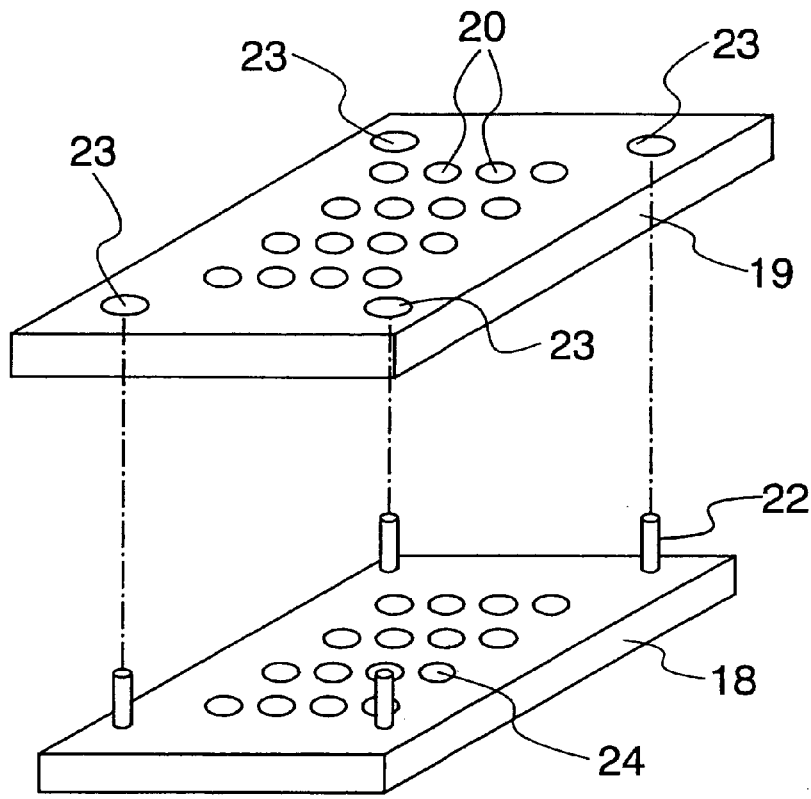
FIG. 1A is a perspective view of a template and a mounting board, showing a first conventional technique.
Figure 1B:
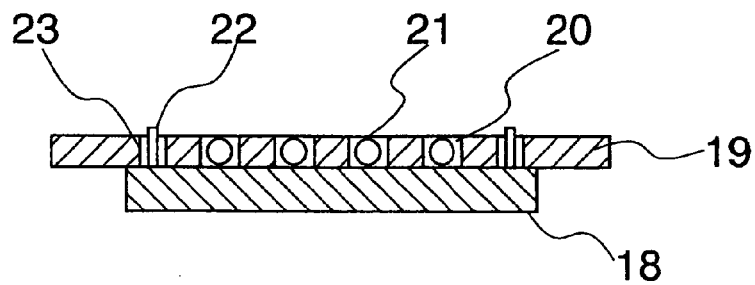
FIG. 1B is a cross-sectional view of the template and the mounting board of FIG. 1A after arrangement of metallic balls.
Figure 2:
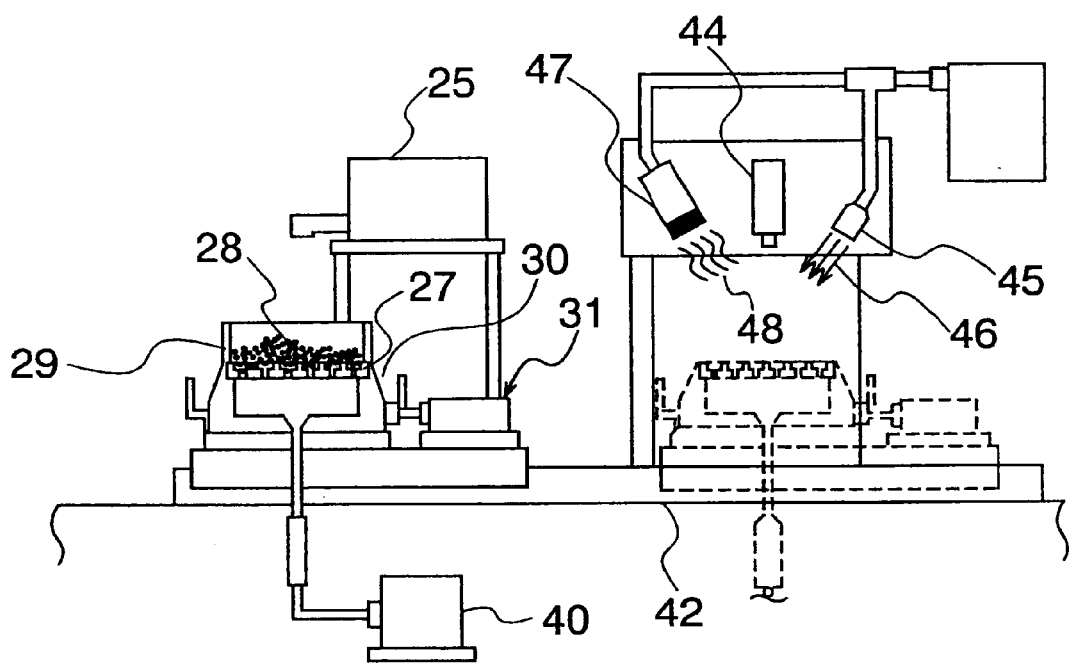
FIG. 2 is a front view of a solder ball arrangement device, showing a second conventional technique.
Figure 3:
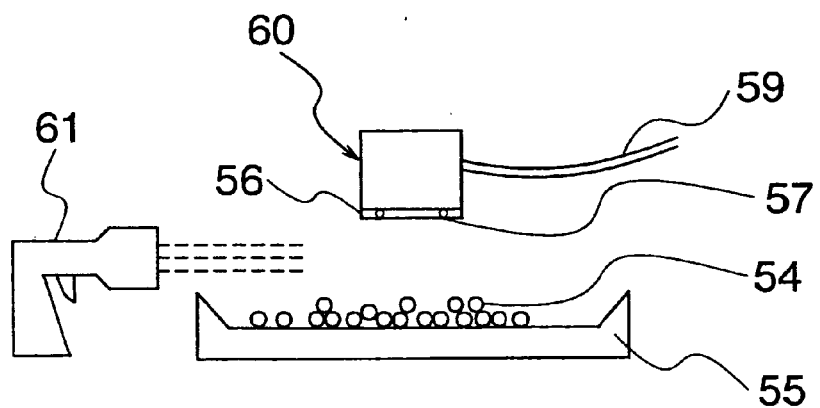
FIG. 3 is a side view of a metallic ball arrangement device, showing a third conventional technique.

Now, the present invention is more specifically described with reference to accompanying drawings, wherein similar constituent elements are designated by the same or similar reference numerals.

Figure 4:
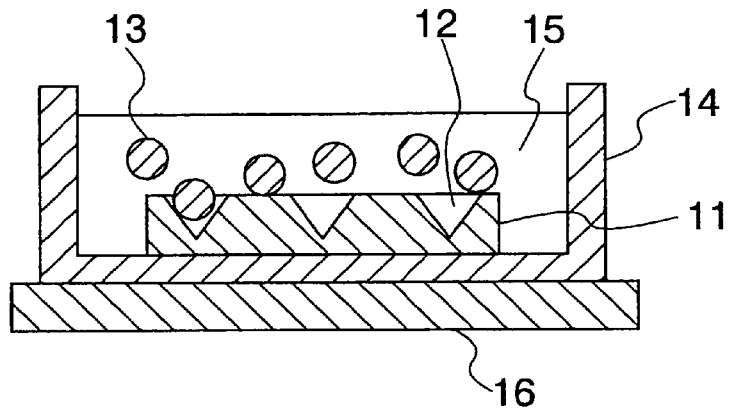
FIG. 4 shows in a cross-section a process for arranging metallic balls on a template according to a first embodiment of the present invention.

Referring to FIG. 4, a silicon template 11 having an array of minute holes 12 formed thereon is immersed in ethanol 15 and fixed on the bottom of an ethanol bath 14. The minute holes 12 are formed by etching the surface of a silicon plate. Minute metallic balls 13 are then supplied onto the template 11, and eventually received in the minute holes 12 by supplying vibration and/or reciprocation from a vibration plate 16 to the template 11 from the bottom of the ethanol bath 14. The vibration and reciprocation are effected under the condition such that the minute metallic balls 13 once entered the minute holes 12 do not spin out from the minute holes 12.

Each hole 12 on the silicon template 11 has a shape of pyramid which is advantageously obtained by anisotropic etching technique. The depth of the hole 12 is such that when a metallic ball 13 is received in the hole, the top of the metallic ball 13 is substantially flush with or slightly protrudes from the top surface of the silicon template 11.

In the present embodiment, the arrangement of the metallic balls 13 in the ethanol ambient provides an efficient process without cohesion of the metallic balls 13 which may be caused by electrostatic charge or moisture. After arranging the minute metallic balls 13 in the respective holes 12, the ethanol attached onto the metallic balls 13 is volatilized to thereby dry the surface of the metallic balls 13 and the template 11. The ethanol, however, remains in a small amount in the space between the minute metallic balls 13 and the bottom of the minute holes 12 of the template 11. Thus, the minute metallic balls 13 are slightly attracted to the minute holes 12 by a minute surface tension of the ethanol and not removed easily from the holes 12, which fact provides an advantage of easy handling after the arrangement.

Figure 5:
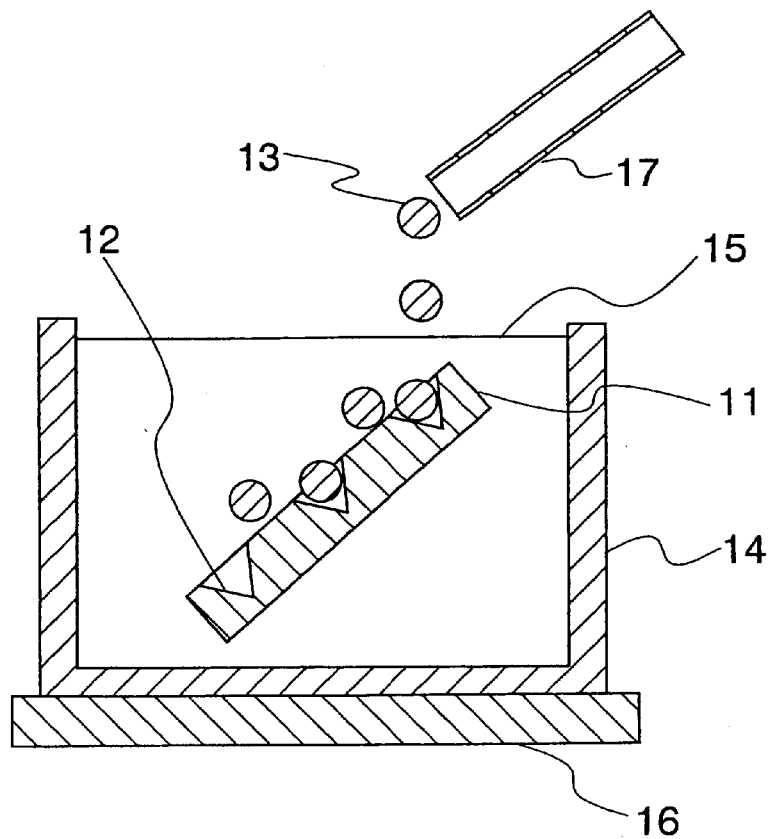
FIG. 5 shows in a cross-section a process for arranging metallic balls on a template according to a second embodiment of the present invention.

Referring to FIG. 5, a method according to a second embodiment of the present invention is similar to the first embodiment except that the template 11 is inclined in the ethanol 15 before receiving the metallic balls 13. Minute metallic balls 13 are supplied to the upper side of the template 11 by dropping the metallic balls 13 from a ball feeder 17. At this stage, since the minute metallic balls 13 are dropped through ethanol 15, falling energy by gravity is consumed by the ethanol 15 to reduce the speed of the metallic balls 13. Thus, the minute metallic balls 13 do not bounce when the metallic balls 13 reach the template 11 and descend slowly along the top surface of the template 11. While the minute metallic balls 13 descend along the surface of the template 11, the metallic balls 13 are received in the minute holes 12 one by one, thereby forming an array of the metallic balls 13. It is preferable to supply moderate vibration and/or reciprocation so that the minute metallic balls 13 move uniformly over the surface of the template 11.

In the second embodiment, it is possible to arrange minute metallic balls 13 on the template 11 efficiently, similarly to the first embodiment, without cohesion of the metallic balls 13. Other advantages similar to those in the first embodiment are also obtained in the second embodiment.

The template 11 may be made of stainless steel aluminum or ceramic instead of silicon. It is preferable that the surface of the template 11 is smooth so as to allow the minute metallic balls 13 to move uniformly. The ethanol 15 may be replaced by methanol, isopropyl alcohol and water or a mixture thereof. It is preferable that the liquid has a significant conductivity to deprive the metallic balls 13 of electrostatic charge. The holes 12 may be of conical shape or other suitable shape instead of pyramid shape.

Since the above embodiments are described only for examples, the present invention is not limited to the above embodiments and various modifications or alterations can be easily made therefrom by those skilled in the art without departing from the scope of the present invention.

What is claimed is:

1. A method for arranging metallic balls on a template having a plurality of holes, comprising the steps of immersing the template in a liquid, dropping the metallic balls through the liquid toward the template to receive the metallic balls in the respective holes.

2. A method as defined in claim 1, further comprising the step of including the template before said dropping of the metallic balls.

3. A method as defined in claim 1, firer including the step of vibrating and/or reciprocating the template.

4. A method as defined in claim 1, said liquid is selected from the group consisting of ethanol, methanol isopropyl alcohol, water and mixture thereof.

5. A method as defined in claim 1, wherein said template is made of silicon.

6. A method as defined in claim 1, wherein said holes are formed by anisotropic etching.

7. A method as defined in claim 1, wherein said liquid is electrically conductive.

* * * * *